United States Patent [19]
Asmussen et al.

[11] Patent Number: 5,311,103
[45] Date of Patent: * May 10, 1994

[54] APPARATUS FOR THE COATING OF MATERIAL ON A SUBSTRATE USING A MICROWAVE OR UHF PLASMA

[75] Inventors: Jes Asmussen, Okemos; Jie Zhang, East Lansing, both of Mich.

[73] Assignee: Board of Trustees operating Michigan State University, East Lansing, Mich.

[*] Notice: The portion of the term of this patent subsequent to Mar. 6, 2007 has been disclaimed.

[21] Appl. No.: 890,877

[22] Filed: Jun. 1, 1992

[51] Int. Cl.$^5$ .............................................. H01J 7/24
[52] U.S. Cl. ........................ 315/111.81; 315/111.21; 315/111.41; 315/111.71; 204/192.1; 204/298.02; 204/298.04; 204/298.05; 118/723 R; 118/729; 333/248; 423/289; 427/233
[58] Field of Search ................... 315/111.21, 111.41, 315/111.71, 111.81; 204/192.1, 192.11, 298.02, 298.04, 298.05; 118/723, 729; 333/248; 423/289; 427/233

[56] References Cited

U.S. PATENT DOCUMENTS

| | | |
|---|---|---|
| 3,030,187 | 4/1962 | Eversole . |
| 3,030,188 | 4/1962 | Eversole . |
| 4,585,668 | 4/1986 | Asmussen et al. . |
| 4,691,662 | 9/1987 | Asmussen et al. . |
| 4,727,293 | 2/1988 | Asmussen et al. . |
| 4,777,336 | 10/1988 | Asmussen et al. . |
| 4,792,772 | 12/1988 | Asmussen . |
| 4,906,900 | 3/1990 | Asmussen . |
| 4,940,015 | 7/1990 | Kobashi et al. ................. 118/729 |
| 4,943,345 | 7/1990 | Asmussen et al. . |

OTHER PUBLICATIONS

F. P. Bundy, H. T. Hall, H. M. Strong, and R. H. Wentoff, Jr., "Man-made Diamond", Nature, 176, 51 (1955).
J. C. Angus, H. A. Will, and W. S. Stanko, J. Appl. Phys. 39, 2915 (1968).
B. V. Deryaguin et al., J. Cryst. Growth 2, 380 (1968).
B. V. Spitsyn et al, J. Cryst. Growth 52, 219 (1981).
S. Matsumoto et al, Jpn. J. Appl. Phys. 21 part 2, L183 (1982).
S. Matsumoto et al, J. Mater. Sci., 17, 3106 (1982).
M. Kamo et al, J. Cryst. Growth 62, 642 (1983).
S. Matsumoto et al, J. Mater. Sci., 18, 1785 (1983).
S. Matsumoto, J. Mater. Sci. Lett, 4, 600 (1985).
S. Matsumoto et al, Appl. Phys. Lett., 51, 737 (1987).
K. Suzuki et al, Appl. Phys. Lett. 50, 728 (1987).
C. V. Deshpandey et al, Vac Sci. Technol. A7, 2294 (1989).
W. Zhu et al, Proc. IEEE 79, No. 5, 621 (1991).
H. Kawarada, K. et al, Jpn. J. Appl. Phys. 26, L1032 (1987).
P. K. Bachmann et al, Extended Abstracts Diamond & Diamond-like Materials Synthesis, Materials Research Society Pittsburgh, Pa. 1988, p. 99.
J. Zhang et al, J. Vac. Sci. Technol. A 8, 2124 (1990).

*Primary Examiner*—Paul Gensler
*Assistant Examiner*—Haissa Philogene
*Attorney, Agent, or Firm*—Ian C. McLeod

[57] ABSTRACT

An improved radiofrequency wave apparatus (10) which provides a relatively large diameter (on the order of magnitude 500 millimeters) plasma (56) for the coating of a material on a surface of a substrate (50) is described. The apparatus has a movable stage (54), which is used to change the position of the substrate with respect to the plasma. The radiofrequency waves are preferably microwaves or UHF waves (2.45 GHz or 915 MHg). The apparatus has a probe (30) which is mounted along the longitudinal axis (A—A) through a sliding short (16). The apparatus operates in the TM mode and is particularly useful for uniformly coating a relatively large surface of the substrate (or a number of smaller surfaces of substrates at the same time) with a material which is formed in the plasma. The apparatus has been used for depositing diamond films on a number of substrates (Si, $Si_3N_4$ and the like).

21 Claims, 12 Drawing Sheets

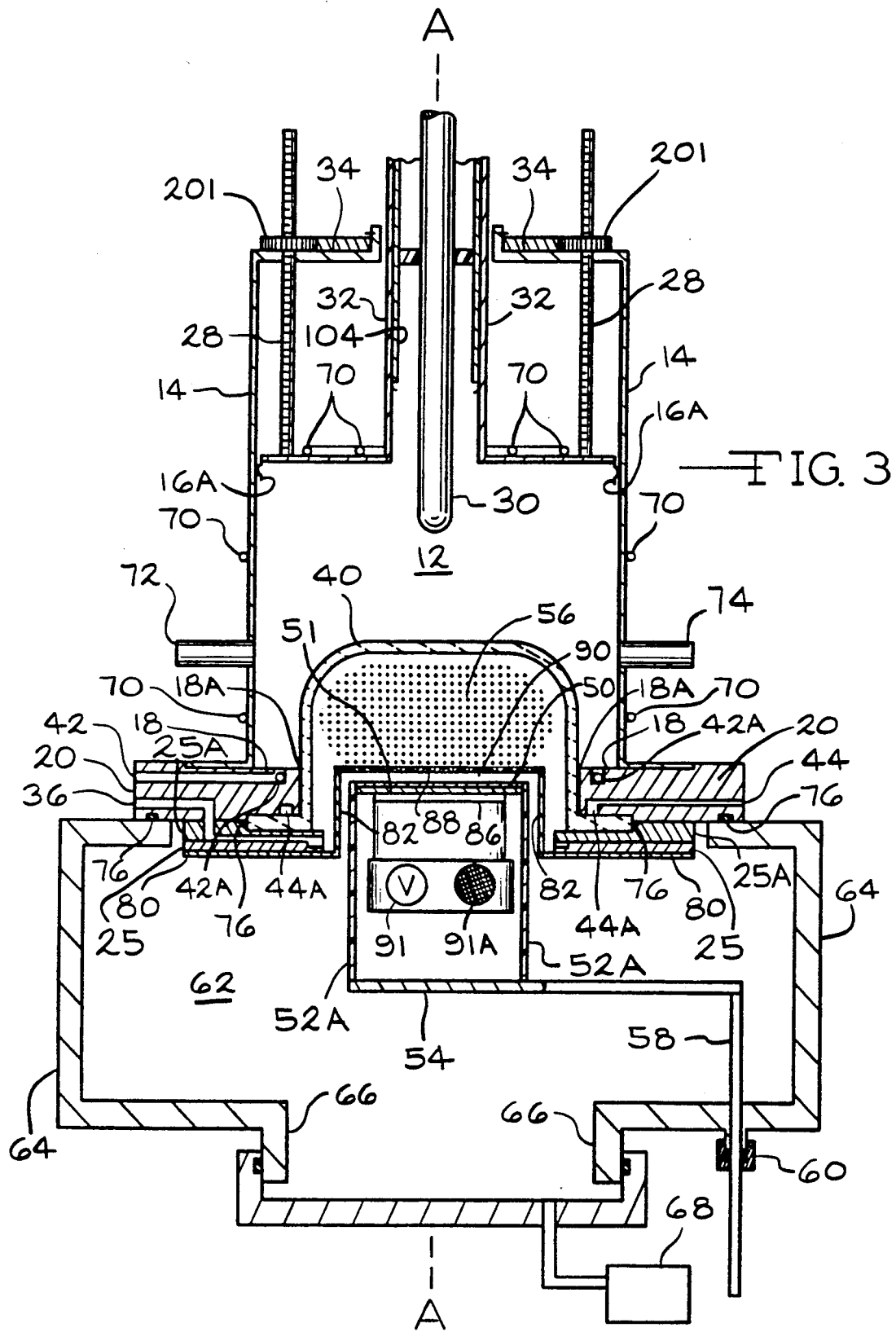

… … …
APPARATUS FOR THE COATING OF MATERIAL ON A SUBSTRATE USING A MICROWAVE OR UHF PLASMA

BACKGROUND OF THE INVENTION

1. Field of the Invention

The present invention relates to an improved apparatus for coating a surface of a substrate with a material (such as diamond film) using a plasma generated by a microwave or UHF power source. In particular, the present invention relates to an apparatus which generates a relatively wide plasma adjacent to the surface of the substrate being coated to provide a uniform coating across the surface of the substrate.

2. Prior Art

Providing a thin non-reactive film of a material on a substrate to improve the properties of the substrate has always been an important part of scientific and industrial research. The demand for coated substrates leads to the interest in the design and construction of production apparatus to accomplish these technological advancements.

Diamond, having unique mechanical, optical and electrical properties, is one of the most valuable scientific and technological materials. In 1955, Bundy and co-workers succeeded in the reproducible synthesis of diamond (F. P. Bundy, H. T. Hall, H. M. Strong, and R. H. Wentoff, Jr., "Man-made diamond", Nature, 176, 51 (1955)) with a molten transition metal solvent-catalyst at pressures where diamond is the thermodynamically stable phase of carbon.

Diamond growth at low pressures where graphite is the stable carbon phase can be traced back to W. G. Eversole (W. G. Eversole, U.S. Pat. Nos. 3,030,187 and 3,030,188)), Angust et al. (J. C. Angus, H. A. Will, and W. S. Stanko, J. Appl. Phys. 39, 2915 (1968)); and Deryaguin et al. (B. V. Deryaguin, D. V. Fedoseev, V. M. Lukyanovich, B. V. Spitsyn, V. A. Ryabov, and A. V. Lavrentyev, J. Cryst. Growth 2, 380 (1968)), but the low growth rate (less than 0.1 micrometer per hour) could not be of practical commercial importance and thus prevented worldwide interest at that time.

A breakthrough in the synthesis of diamond at low pressures came in the late 1970's and early 1980's, when a group of Soviet researchers (B. V. Spitsyn, L. L. Bouilov and B. V. Deryagin, J. Cryst. Growth 52, 219 (1981)) and Japanese researchers (S. Matsumoto, Y. Sato, M. Kamo, N. Setaka, Jpn. J. Appl. Phys. 21, part 2, 183 (1982)) published a series of research papers on diamond film growth at a higher growth rate (several micrometers per hour) from hydrocarbon-hydrogen gas mixtures. Since then, various techniques have been developed for diamond film growth at low pressures. These techniques can be divided into five major categories: (1) thermally activated or hot filament activated chemical vapor deposition (CVD) (S. Matsumoto, Y. Sato, M. Kamo, N. Setaka, Jpn. J. Appl. Phys. 21, part 2, L183 (1982); S. Matsumoto, Y. Sato, M. Tsutsumi and N. Setaka, J. Mater. Sci., 17, 3106 (1982)); (2) high frequency plasma enhanced CVD (M. Kamo, Y. Sato, S. Matsumoto and N. Setaka, J. Cryst. Growth 62, 642 (1983); S. Matsumoto and Y. Matsui, J. Mater. Sci., 18, 1785 (1983); S. Matsumoto, J. Mater. Sci. Lett, 4, 600 (1985); S. Matsumoto, M. Hino and T. Kobayashi, Appl. Phys. Lett., 51, 737 (1987)); (3) direct current discharge enhanced CVD (K. Suzuki, A. Sawabe, H. Yasuda, and T. Inuzuka, Appl. Phys. Lett., 50, 728 (1987)); (4) combustion flame (Y. Hirose and M. Mitsuizumi, New Diamond, 4, 34 (1988)); and (5) other and hybrid techniques. All of these techniques are based on the generation of atomic hydrogen near the thin film growing surface. A very common method of synthesis is microwave plasma assisted CVD. This method has shown excellent potential for growing high quality diamond films and variations of this technique are now in common use in many laboratories, but has not reached the stage of commercialization.

There is a need for the development of microwave plasma reactors for the deposition of diamond and diamond thin film coating on other materials. Since there are no electrodes present in the microwave plasma, the problem of metallic contamination in the process of diamond deposition does not exist. Compared to the erosion of filaments in hot filament reactors, erosion of electrodes in direct current reactors and nozzle erosion in combustion flame reactors, microwave plasma diamond film deposition is a cleaner process. It is also easier to control and optimize the deposition process which makes microwave plasma reactors the most promising technique for stably growing pure, uniform, and high quality diamond films (C. V. Deshpandey and R. F. Bunshah, J. Vac. Sci. Technol. A7, 2294 (1989); W. Zhu, B. Stoner, B. Williams, and J. T. Glass, Proc. IEEE 79, no. 5, 621 (1991)).

Diamond film deposition using microwave plasma has been achieved by several different apparatus. The first was reported by Kamo et al. (M. Kamo, Y. Sato, S. Matsumoto and N. Setaka, J. Cryst. Growth 62, 642 (1983)). A silica tube 40 millimeter in diameter passes through the sleeves attached to the waveguide. The tube serves as the deposition chamber. Microwave energy (2.45 GHz, 9.15 MHz) generated by the magnetron is transmitted to the chamber through a set of waveguides, a power monitor and a tuner. The position of the plasma was adjusted into the center of the deposition chamber, where the substrate was held by an alumina basket. Deposition was performed by passing a mixture of hydrogen and methane to the chamber and then applying microwave power to induce a microwave glow discharge.

A magneto-microwave plasma reactor for diamond growth was reported by Kawarada et al (H. Kawarada, K. S. Mar and A. Hiraki, Jpn. J. Appl. Phys. 26, L1032 (1987)). It is composed of a microwave generator, a waveguide, Helmholtz-type magnetic coil, a round waveguide (a discharge area) with TE11 mode, and a reaction chamber. The inner diameter of the round waveguide is 160 millimeter. The magnetic field distribution is intended to control the deposition under a high density plasma. The plasma density is the highest around the position where the magnetic field corresponds to the electron cyclotron resonance conditions (875 Gauss in this case). The position can be moved by the intensity of applied magnetic field and be set around the substrate. Observed diamond particles and films have been obtained on whole substrates as large as 30 millimeters in diameter. The pressure where the high quality diamond has been formed is around 10 Torr. Diamond films were deposited at pressures from 4 to 50 Torr.

Bachmann et al. (P K. Bachmann, W. Drawl, D. Knight, R. Weimer, and R. F. Messier, in Extended Abstracts Diamond and Diamond-like Materials Synthesis, edited by G. Johnson, A. Badzian, and M. Geis, Materials Research Society, Pittsburgh, Pa., 1988, p. 99) reported a bell jar microwave plasma reactor for diamond film growth. The cavity allows the insertion of a 1 inch graphite disk as a substrate holder for experiments with microwave/plasma heated samples. The interior of the bell jar reactor can be replaced by a 3 inch flat spiral resistance heater that can be mounted through the bottom of the cavity. Deposition experiments using plasma heated single crystal silicon substrates resulted in diamond coating over sample diameters of 25 millimeters. Coatings of more than 65 millimeter (2.75 inch) diameter were deposited on silicon, using the separate substrate heater. Pressure variations between 40 and 70 Torr were found to have little effect on the diamond growth rate in a bell jar reactor. The variation of the total flow between 200 sccm and 600 sccm (while keeping the methane concentration constant at 0.5%) did not affect the growth rate. The plasma formed in the reactor has ball shape.

A microwave disk reactor for diamond film growth was reported by the present inventors et al (J. Zhang, B. Huang, D. K. Reinhard and J. Asmussen, J. Vac. Sci. Technol. A 8, 2124 (1990)) and tested in a commercial setting. The disk reactor consists of the cylindrical side walls which form the outer conducting shell of the cavity applicator. The water-cooled sliding short, the cavity bottom surface, and the water-cooled base-plate, along with the cavity side walls, form the cylindrical excitation cavity. Input gas flows into the quartz chamber via the input gas channel inside the base-plate. A 92.5 millimeter inside diameter quartz disk confines the working gas to the lower section of the cavity applicator where the microwave fields produce a hemisphere shaped plasma adjacent to the substrate. Microwave power is coupled into the cavity through the side-feed coaxial power input probe. A discharge is ignited in the disk shaped zone by exciting the cavity in a single plasma loaded resonant mode. The substrate temperature is measured through the screened top window using an optical pyrometer.

To successfully commercialize diamond synthesis at low pressures, diamond growth at high rates and low deposition temperatures on large area substrates is desirable. Each of the microwave apparatuses described above has its advantages and disadvantages for diamond film deposition. What their disadvantages have in common is that they can not be easily scaled up for large area diamond film deposition. The reactor reported by Kamo et al has two disadvantages, first, the substrate size is limited by the inside diameter of the silica tube, which is 40 millimeters, and the system is not easily scalable for diamond film growth on a large surface since the diameter of the silica tube is limited by the size of the rectangular waveguide; second, the plasma generated inside the silica tube is very close to the inside walls, under the conditions suitable for diamond deposition, erosion of the silica walls and hence contamination of the diamond film are likely. The reactor reported by Kawarada et al uses a narrow, electron cyclotron resonance ring to generate the high density plasma ring. Non-uniformity in the deposited film can be expected as an inherent result of the non-uniform excitation of the plasma, especially for diamond deposition over a larger surface. The reported surface area for diamond growth was 30 millimeters in diameter. It has a narrow pressure region for diamond film growth, namely from 4 to 50 Torr. At pressures above 50 Torr, the discharge area becomes unstable and below 4 Torr, the products contain graphite or SiC phase and in extreme cases the products are only these phases. The reactor reported by Bachmann et al. uses a plasma ball and the substrate is located near the lower pole of the plasma ball. The reactive species distribution over the substrate surface is inherently non-uniform. This is especially true when the substrate surface extends further away from the lower pole of the plasma ball. The reported coating surface area is 25 millimeters in diameter with the plasma. A separate heater is needed to coat a surface of 65 millimeters in diameter. The location of the substrate and substrate holder are fixed in order to generate the ball shaped plasma. External tuning is needed in order to minimize the reflected power from the reactor since there is only one internal adjustment (i.e. the antenna) available for microwave coupling.

The microwave disk reactor reported by Asmussen et al uses a hemisphere shaped plasma to deposit diamond film on a substrate. The reactive species covering a surface of 40 millimeters in diameter is uniform. But in this reactor, the power input comes from the side of the cavity walls and produces an inherent non-uniform electromagnetic field near the excitation probe. This near field effect gets stronger as the input power and quartz disk inside diameter are increased, creating a non-uniform and unstable plasma. Hence this reactor cannot be used to uniformly deposit diamond on surface areas larger than 50 millimeters in diameter when operating at pressures above 5 Torr.

U.S. Pat. No. 4,906,900 to Asmussen describes an apparatus wherein a probe is aligned parallel to, but offset from the longitudinal axis. The purpose of this invention was to provide a long narrow apparatus for retrofitting existing vacuum sources. There is a suggestion that the apparatus could be used for diamond thin films; however, the device does not have sufficient cross-sectional areas in the chamber for commercial purposes.

U.S. Pat. No. 4,792,772 to Asmussen describes a more conventional commercially available apparatus. The problem is that this apparatus does not provide a completely uniform plasma at the high pressures (i.e. 20 to 100 Torr) desirable for high growth rates because of the position of the probe. U.S. Pat. No. 4,943,345 to Asmussen and Reinhard shows an apparatus wherein a nozzle is provided to direct the flow of the excited species from the plasma. U.S. Pat. No. 4,691,662 to Roppel, Asmussen and Reinhard describes a dual plasma device. U.S. Pat. No. 4,630,566 to Asmussen and Reinhard; U.S. Pat. No. 4,727,293 to Asmussen, Reinhard and Dahimene, and U.S. Pat. No. 4,585,668 to Asmussen show various plasma generating devices. All of these patents describe apparatus where the probe enters the cavity from the side perpendicular to the axis of the cavity.

OBJECTS

It is therefore an object of the present invention to provide an improved apparatus for the coating of a relatively large surface of a substrate with a material, particularly diamond. It is also an objective of the present invention to create a versatile microwave disk reactor that is adaptable to deposit diamond film over a wide range of experimental conditions, i.e., pressure (0.5 to 100 Torr), power (150 to 5000 watts), and on a variety of substrate types, i.e., plane surfaces, tool bits, inserts, and the like. Further, it is an object of the present invention to provide an apparatus which is relatively economical to construct and reliable to use and which produces excellent results. These and other objects will become increasingly apparent by reference to the following description and the drawings.

IN THE DRAWINGS

FIG. 1 is a cross-sectioned view of the improved plasma coating apparatus 10 of the present invention adapted for coating of an exposed surface of a substrate 50 with a diamond film, wherein the substrate 50 being coating lays on a susceptor 51. The susceptor 51 is mounted on a non-metallic tube 52 which stands on a moving stage 54 used to change the position of the substrate 50 with respect to the plasma 56 produced in the cavity 12. The power input probe 30 and short sleeve 32 configuration generates a symmetric plasma 56 inside the quartz disk 40. The metal choke sleeve 26 serves as a floating end of the apparatus 10 and a cut-off of microwave or UHF radiation.

FIG. 1A is a schematic cross-sectioned view of a gear assembly 100 for moving the probe 30 along the axis A—A.

FIG. 1B is a cross-sectioned view along line 1B—1B of FIG. 1A showing a pinion gear 106 mounted in a housing 108 for moving a linear rack 102 to adjust an inner sleeve 104 and the probe 30 relative to the short sleeve 32.

FIG. 1C is a cross-sectioned view along line 1C—1C of FIGS. 1 and 1A showing the gear assembly 200 for moving the excitation probe 30 along the axis A—A by means of moving the short sleeve 32 and the sliding short 16 with respect to the metallic cylinder 14.

FIG. 1D is a cross-sectioned view along line 1D-1D of FIG. 1 showing the plasma 56 inside the quartz disc chamber 40 and with water cooling rings 42A and gas cooling rings 44A for cooling the base plate 20 and the quartz disk channel 40.

FIG. 2 is a schematic cross-sectioned view of the improved plasma coating apparatus 10 showing a variation of the gas flow passage, wherein the metal plate 80 and metallic tube 82 are sealed together to force the source gas to flow through the plasma 56 and flow pattern regulator 84. This gas flow configuration improves the efficiency of the source gas and the uniformity of the coating.

Figure 1:
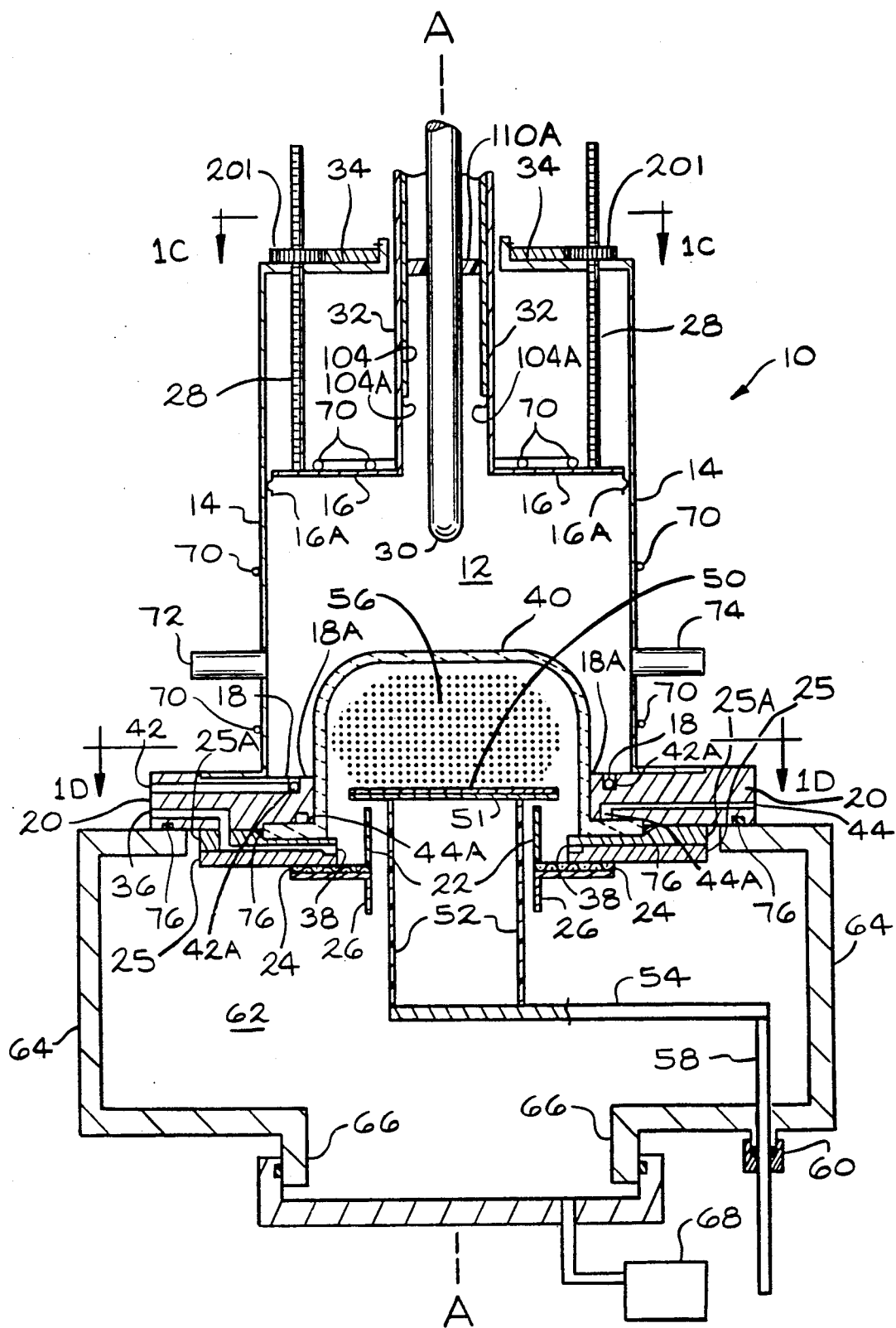

FIG. 3 is a schematic cross-sectioned view of the improved plasma coating apparatus 10 showing a multi-jet process configuration, wherein the metal plate 80 and metallic tube 82 are sealed together to force the gas to flow through the grid 88. The substrate 50 to be coated is located underneath the grid or jet pattern regulator 88. The grid regulator 88 separates the plasma region 56 from the process region 90 where the surface to be coated is located.

Figure 4:
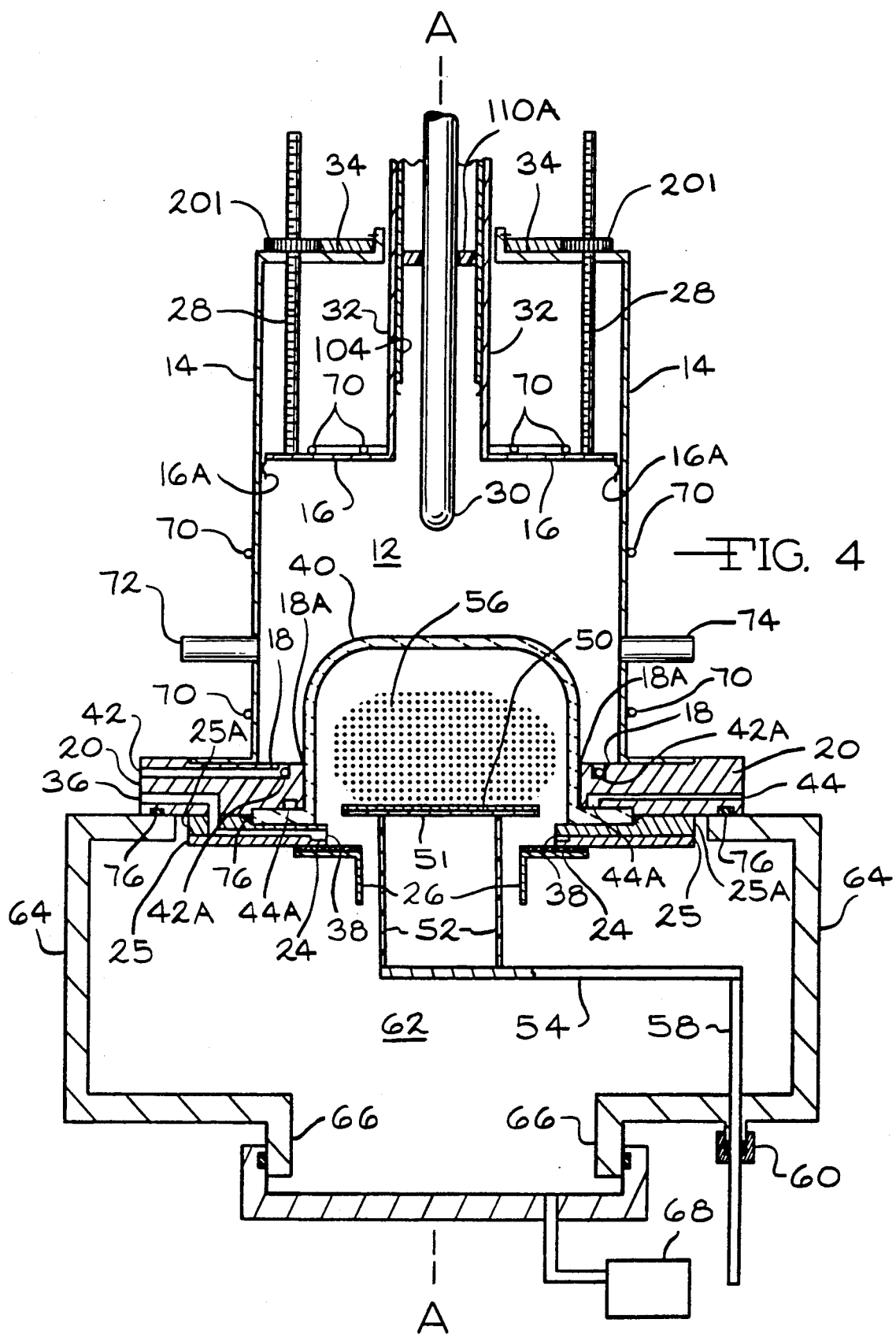

FIG. 4 is a schematic cross-sectioned view of the improved plasma coating apparatus 10 showing the substrate surface 50 to be coated located at a lower section of the quartz disk chamber 40.

Figure 5:
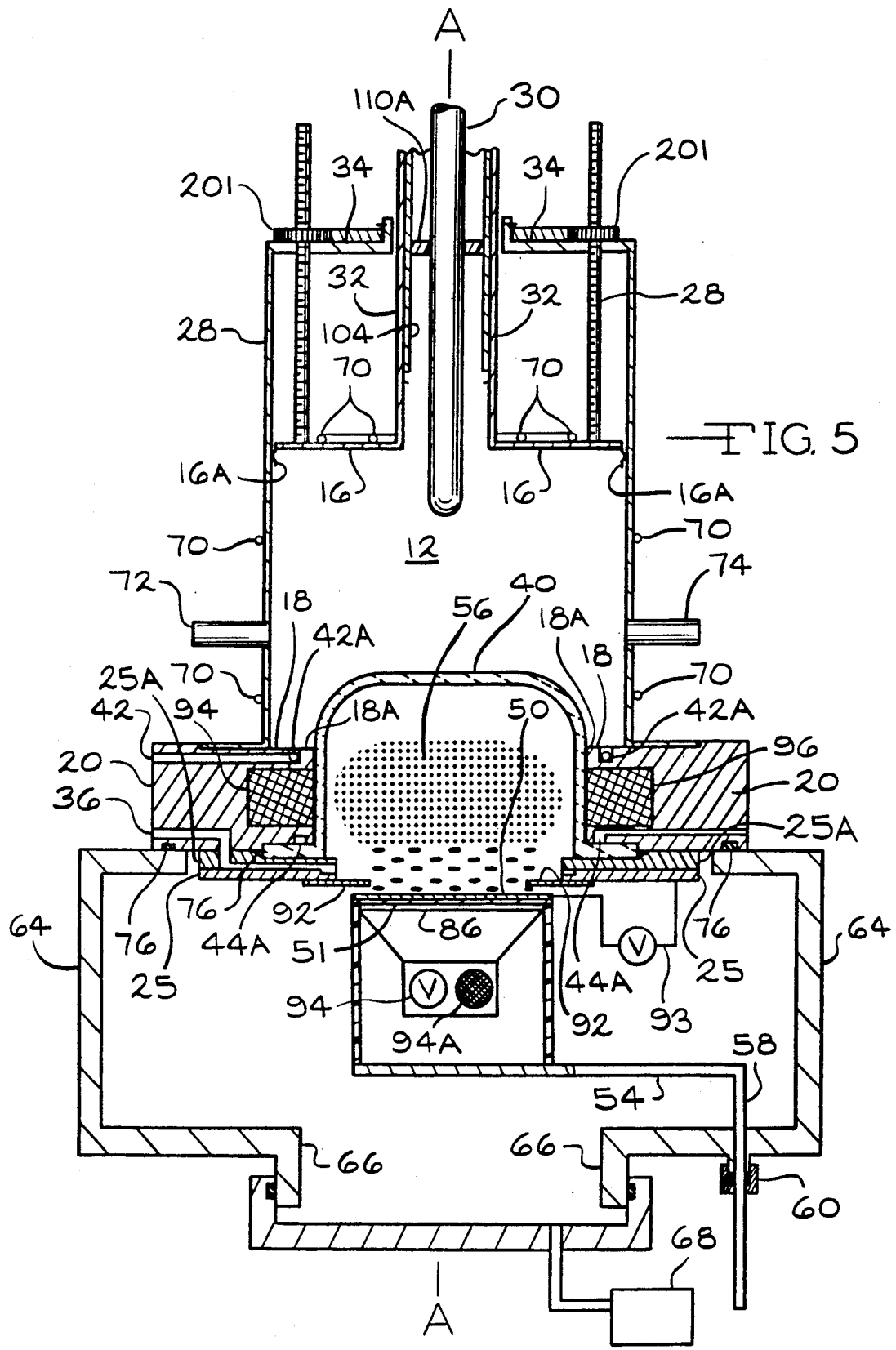

FIG. 5 is a schematic cross-sectioned view of the improved plasma coating apparatus 10 showing the substrate 50 to be coated located outside the quartz disk chamber 40.

Figure 6:
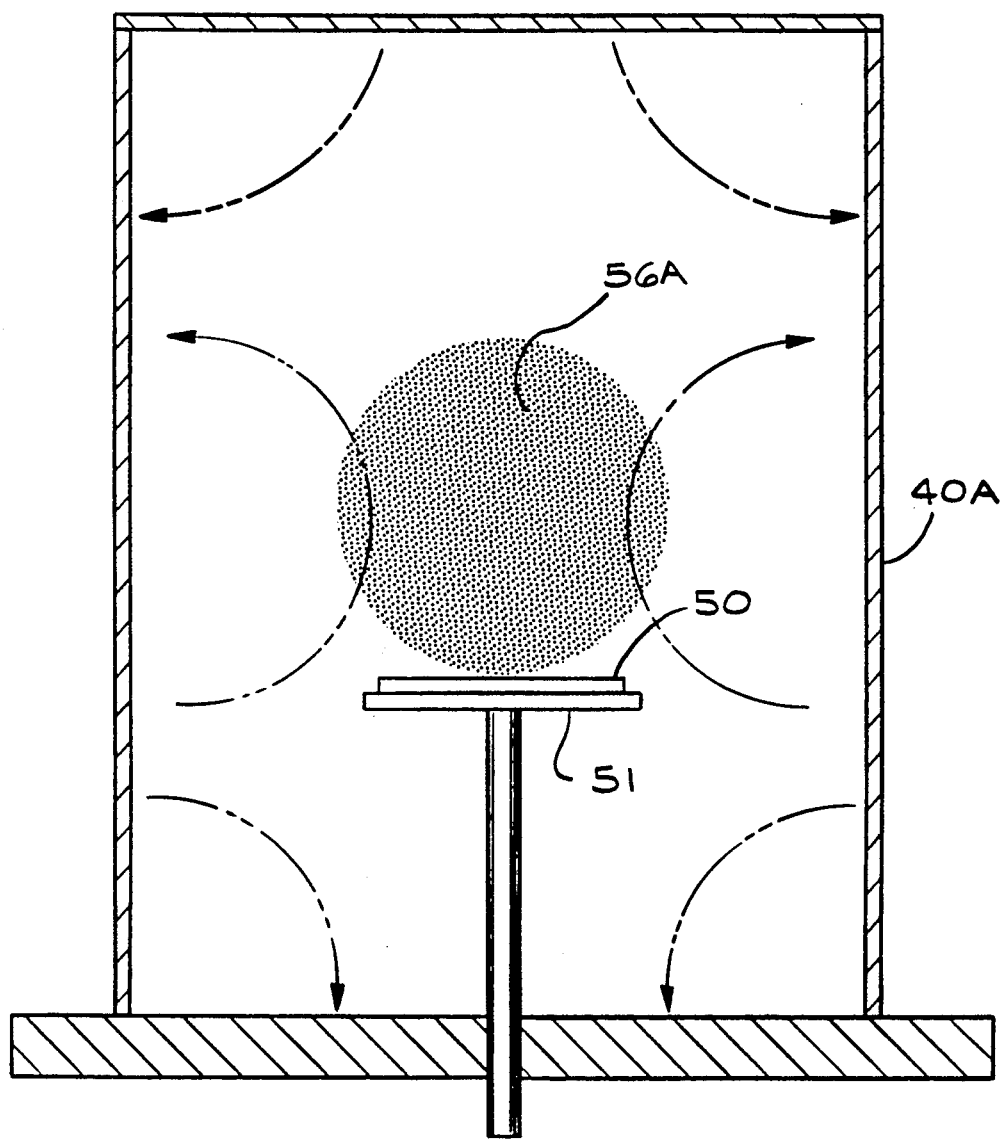

FIG. 6 is a schematic cross-sectioned view of the plasma 56 in a chamber 40A as a sphere 56A above the substrate surface 50.

Figure 7:
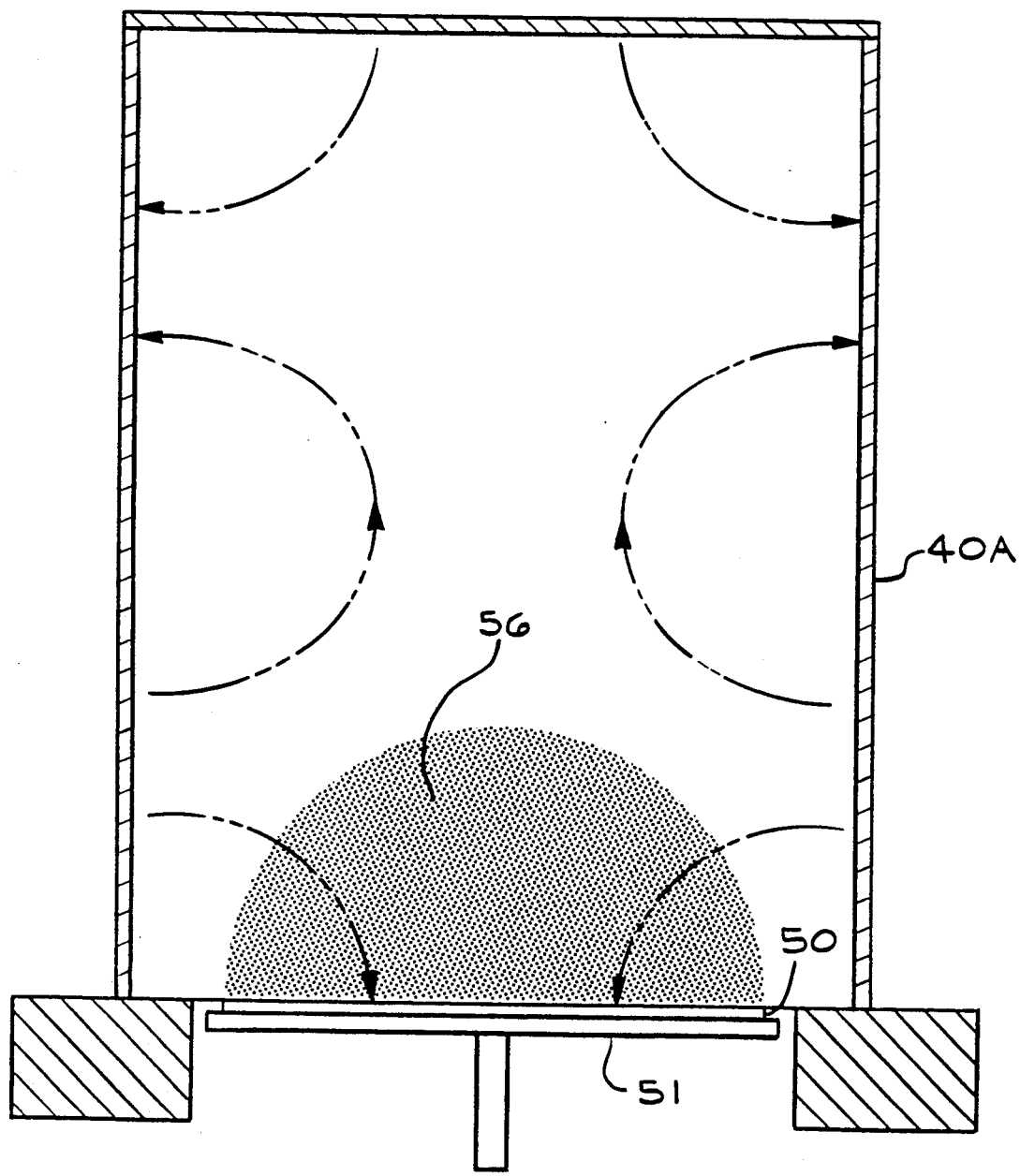

FIG. 7 is a schematic cross-sectioned view of the plasma 56 shown as a hemisphere in the improved plasma coating apparatus 10 shown in FIGS. 1 to 5, by positioning the substrate surface 50 relative to the susceptor 51 in the plasma 56.

GENERAL DESCRIPTION

The present invention relates to a plasma generating apparatus for coating a substrate with a material from a plasma including a plasma source employing a radiofrequency, including UHF or microwave, wave coupler means which is metallic and in the shape of a hollow cavity and which is excited in a TM mode of resonance and optionally including a static magnetic field around the plasma which aids in coupling radiofrequency energy at electron cyclotron resonance and aids in confining ions in the plasma in an electrically insulated chamber means in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; movable metal plate means in the cavity mounted in the coupler means perpendicular to the central longitudinal axis and movable along the central longitudinal axis towards and away from the chamber means; and a movable probe means connected to and extending inside the coupler means for coupling the radiofrequency waves to the coupler means, the improvement which comprises:

(a) the probe means which is elongate and is mounted in the coupler means along the central longitudinal axis of the chamber means and coupler means with an end of the probe in spaced relationship to the chamber means; and (b) stage means which forms part of the cavity and provides for mounting a substrate to be coated with the material, the stage means having a support surface which is in a plane around the longitudinal axis and which is movable towards and away from the plasma in the chamber means so that the substrate can be coated with the material.

The present invention particularly relates to a plasma generating apparatus for coating a substrate with a material from a plasma including a plasma source employing a radiofrequency, including UHF or microwave, wave coupler means which is metallic and in the shape of a hollow cavity and which is excited in a TM mode of resonance and optionally including a static magnetic field around the plasma which aids in coupling radiofrequency energy at electron cyclotron resonance and aids in confining ions in the plasma in an electrically insulated chamber means in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; movable metal plate means in the cavity mounted in the coupler means perpendicular to the central longitudinal axis and movable along the central longitudinal axis towards and away from the chamber means; and a movable probe means connected to and extending inside the coupler means for coupling the radiofrequency waves to the coupler means, the improvements which comprises:

(a) the probe means which is elongate and is mounted in the coupler means along the central longitudinal axis of the chamber means and coupler means with an end of the probe in spaced relationship to the chamber means;

(b) the plate means having an opening along the central longitudinal axis of the chamber means, wherein the plate means supports the probe means so that the probe means can be moved in the opening in the plate means along the central longitudinal axis;

(c) stage means which forms part of the cavity and provides for mounting a substrate to be coated with a material, the stage means having the support surface which is in a plane substantially perpendicular to and around the longitudinal axis and which is movable towards and away from the plasma in the chamber means so that the substrate can be coated with the material from the plasma;

(d) support means for the probe means mounted on the coupler means and including an adjustable means which allows movement of the probe means along the central longitudinal axis of the chamber means so as to vary the spacing between the chamber means and the end of the probe means; and (e) holder means adjustably mounted on the support means and connected to the plate means supporting the probe means so as to allow the plate means to be moved towards and away from the chamber means, wherein movement of the plate means and the probe means in the coupler means achieves a selected TM mode of resonance by iterative movement that adjusts the reflective power to a low level of the radiofrequency wave in the chamber means.

SPECIFIC DESCRIPTION

Figure 1A:
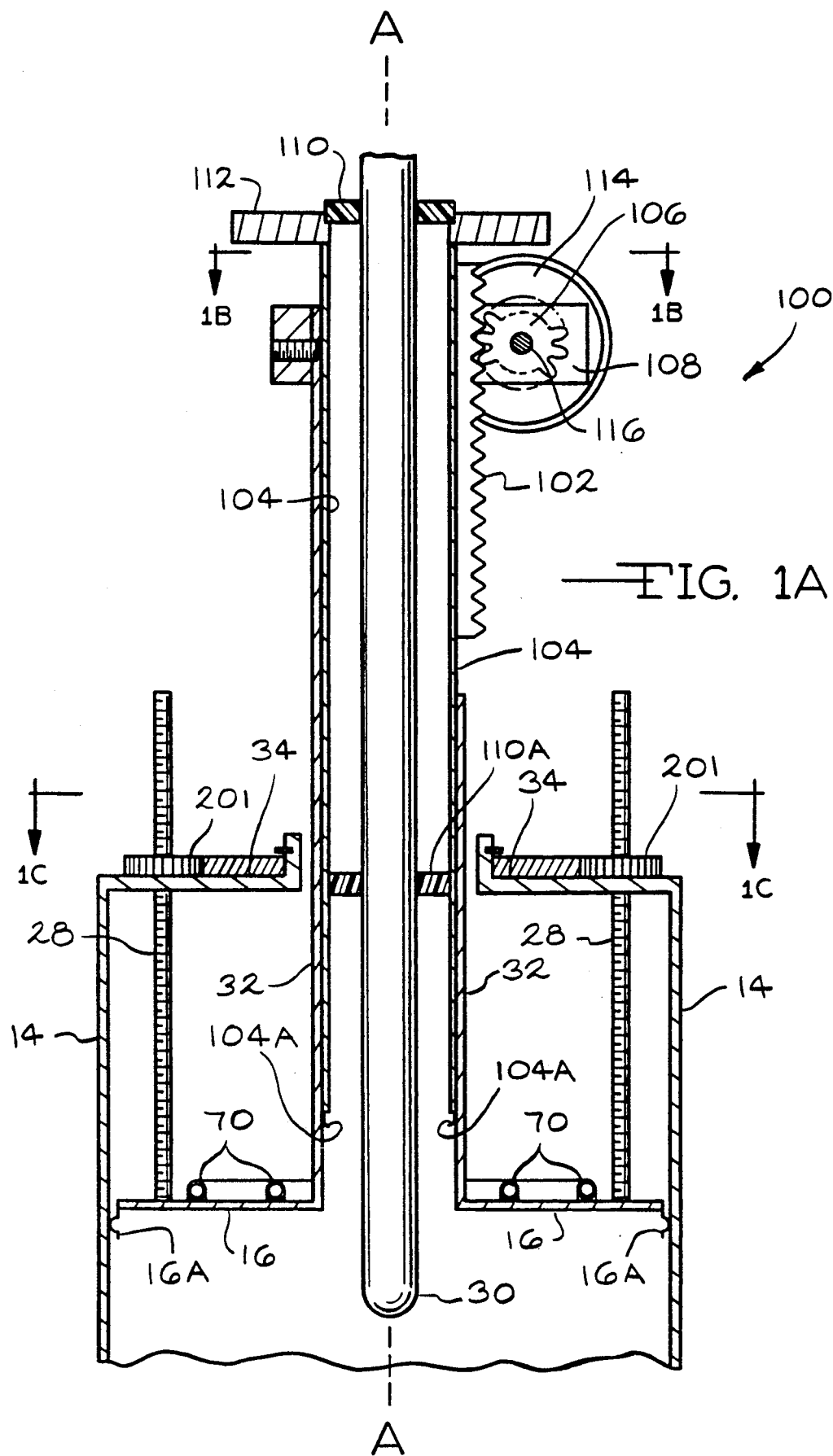
Figure 1B:
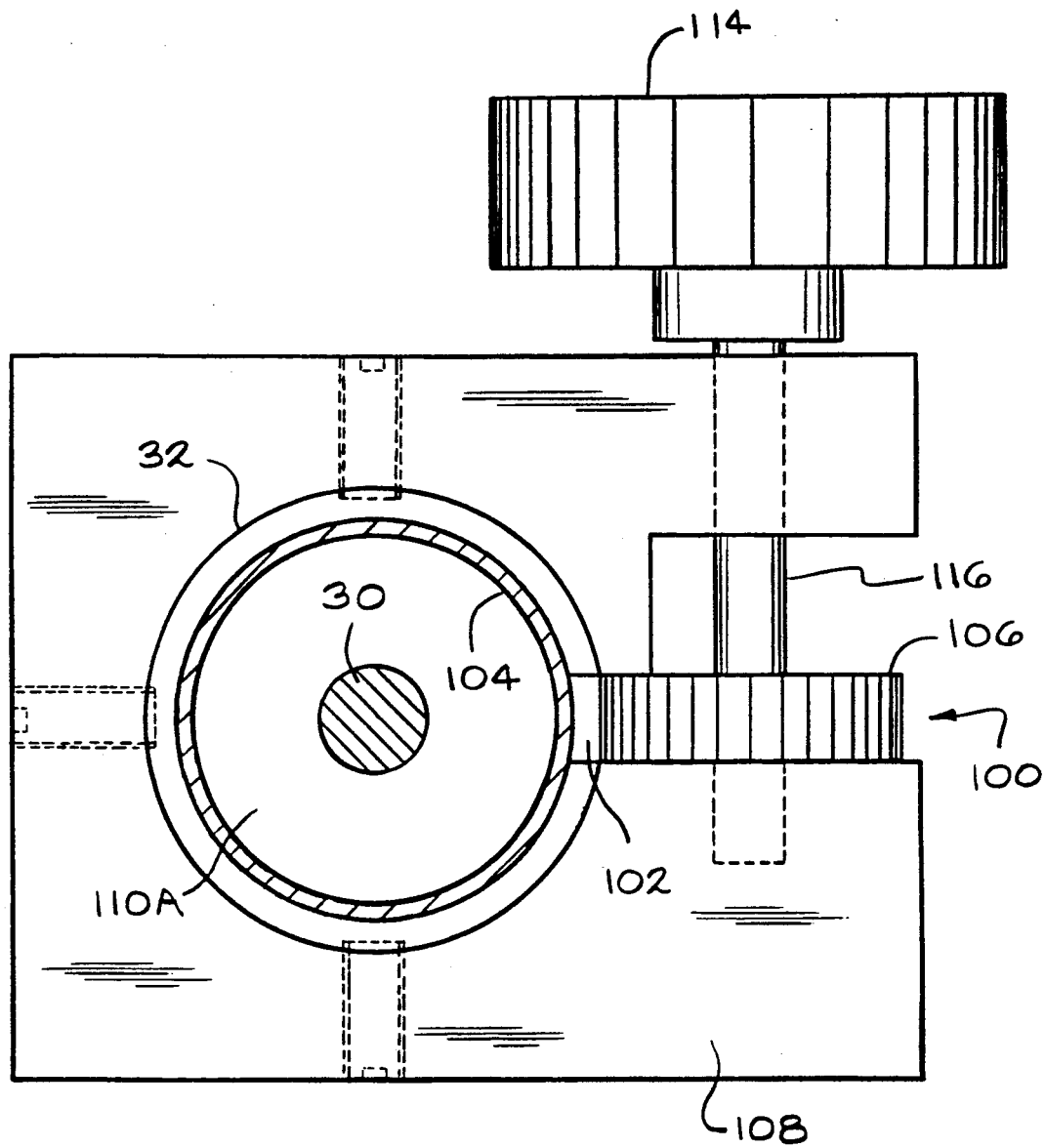
Figure 1C:
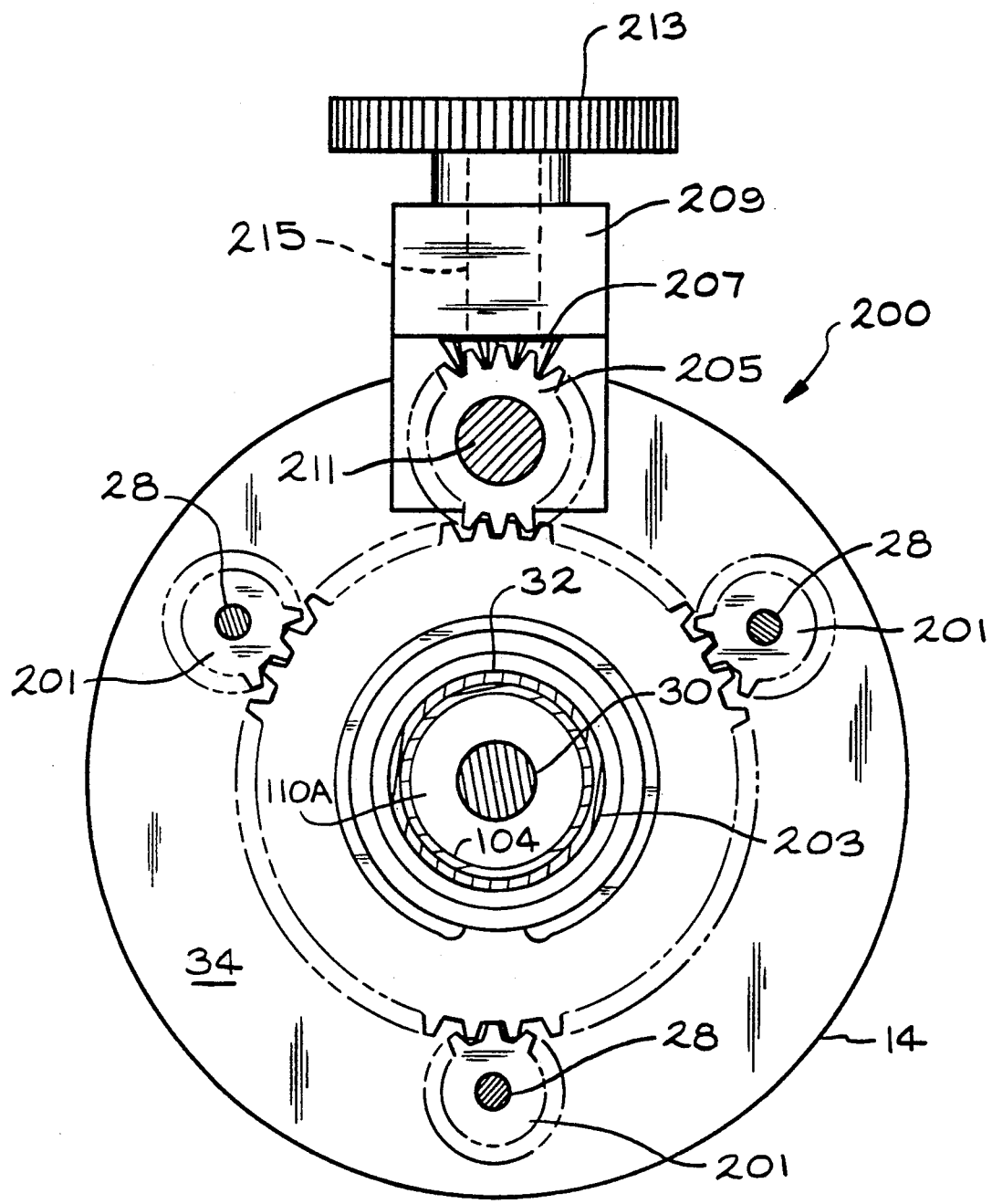
Figure 1D:
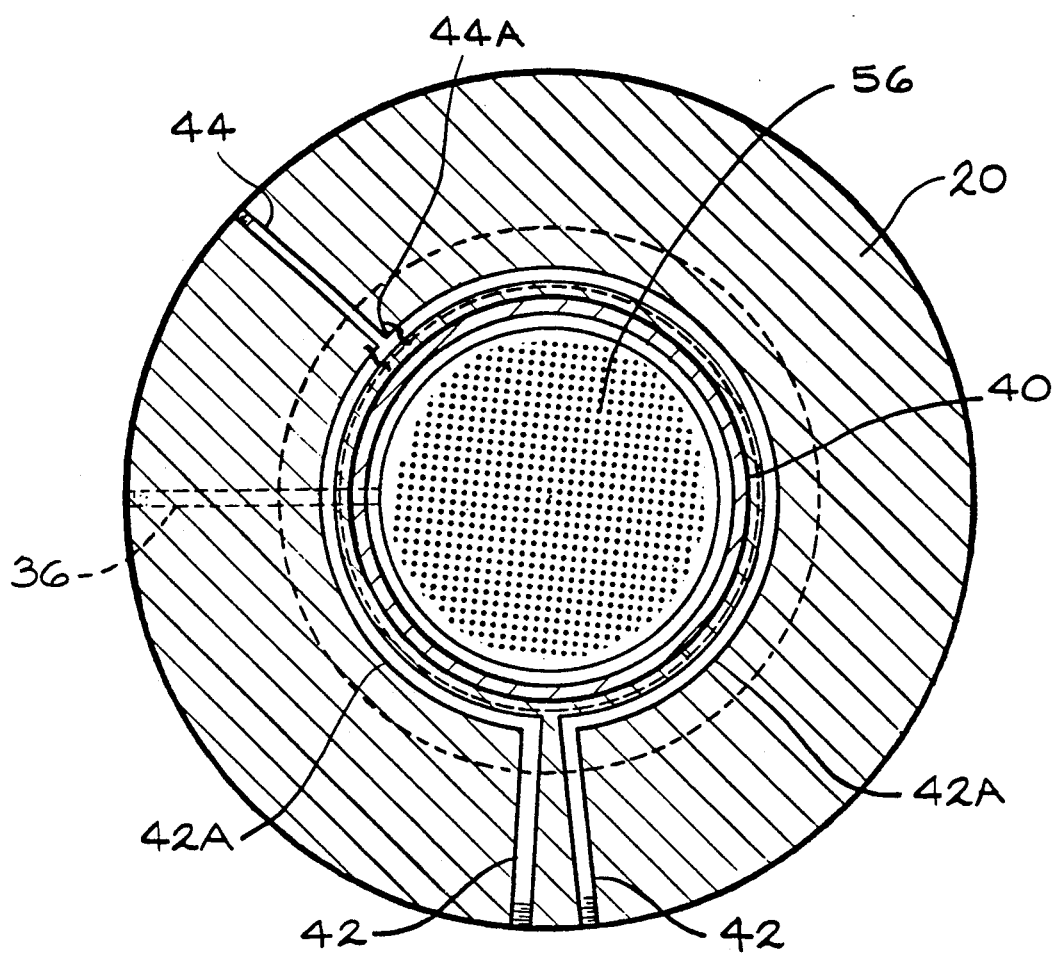

FIGS. 1 to 1D show the improved plasma coating apparatus 10 of the present invention. The principle components of the apparatus 10 are displayed in the longitudinal cross-sectional view of FIG. 1. The cavity 12 has a 178 millimeter inside diameter and is an open ended metallic cylinder 14. A sliding short 16, which is electrically connected to the side walls via the finger stocks 16A, forms the top end of the cavity 12. The lower section of the cavity 12 consists of the cavity bottom surface 18 having a metallic step 18A, the metal base-plate 20, a metal tube 22, supported on a metal screen 24 which is mounted on the underside of a bottom plate 25 supported from the base-plate 20 by intermediate ring plate 25A. An L-shaped metal choke sleeve 26 depends from the bottom side of the screen 24. The sliding short 16 can be moved back and forth along the longitudinal axis A—A of the cavity 12 by the moving rods 28 with a gear assembly 100 (FIGS. 1A and 1B), which provides an adjusting means for the probe 30. The excitation probe 30 is supported in an inner sleeve 104 by insulators 110 and 110A. The inner sleeve 104 provides a holder means for the probe 30 and is in turn adjustably mounted inside of a short sleeve 32. The short sleeve 32 along with the sliding short 16 are adjustable with respect to the metallic cylinder 14 through a mechanical gear assembly 200 as an adjustable means (FIG. 1C) mounted on plate 34 with threaded rods 28 mounted through the gears 201 of the gear assembly 200. The short sleeve 32 along with the gear assembly 200 provide a support means for the probe 30. The inner sleeve 104 has fingers 104A that contact the short sleeve 32 and the inner sleeve 104 moves longitudinally along axis A—A to adjust the distance between the probe 30 and a quartz disk chamber 40. Cap 112 provides for mounting the spacer 110 on inner sleeve 104. A knob 114 is secured to gear 106 by shaft 116, which is rotatably mounted on housing 108.

The adjustable sliding short 16 and excitation probe 30 provide the impedance tuning mechanism to minimize the reflected power in the cavity 12. The source gas, which is supplied through the source gas inlet 36 (FIG. 1D) and annular source gas ring 38, is confined at the lower section of the cavity 12 by the quartz disk chamber 40. The base-plate 20 and quartz disk chamber 40 are cooled by the water cooling channel 42 and gas cooling channel 44 through the annular water cooling rings 42A and gas cooling rings 44A.

The substrate 50 to be coated lays on top of a susceptor 51, which is supported by a non-metallic tube 52. The non-metallic tube 52 stands on a moving stage 54 which is used to change the position of the substrate 50 with respect to the plasma 56. The stage 54 is connected to a movable rod 58 which passes through a vacuum seal 60. The metal tube 22 ensures that the plasma 56 stays on top of the substrate 50 by breaking the resonance near the metal screen 24. The metal choke sleeve 26 provides a floating end of the cavity 12 and a choke of the radiofrequency radiation. This design minimizes the plasma volume by creating a plasma 56 adjacent to the substrate 50. The cylindrical symmetry of the sliding short 16 and probe 30 and system configuration ensures that the plasma 56 generated has an inherent cylindrical symmetry. The apparatus 10 is mounted on a vacuum chamber 62 with chamber walls 64 and a usual chamber conduit 66 leading to a vacuum pump 68.

FIG. 1B shows the details of the gear assembly 100 for moving the probe 30 and the inner sleeve 104 independent of the sliding short 16 and short sleeve 32. The gear assembly includes a linear rack 102 mounted on the inner sleeve 104 and a pinion gear 106 mounted on a housing 108 secured to the short sleeve 32.

FIG. 1C shows the threaded rods 28 mounted on gears 201 of the mechanical gear assembly 200. The gears 201 are turned by gear 203 around the short sleeve 32 by bevel gears 205 and 207 rotatably mounted on housing 209. Gear 205 is mounted on pin 211 secured to housing 209. A second knob 213 attached to shaft 215 is journaled in housing 209 and turns the gear 207 and thus the gears 205, 203 and 201 in succession to move the sliding short 16 along the axis A—A. The basic mechanism is described in U.S. Pat. No. 4,792,772.

FIG. 1D shows a plasma 56 inside quartz disk chamber 40 and water cooling rings 42A and gas cooling rings 44A in base plate 20. Source gas inlet 36 provides the gas for the plasma 56.

Water cooling lines 70 are provided in the sliding short 16 and around the metallic cylinder 14. Air cooling passages 72 and 74 are provided to cool the cavity 12.

Vacuum seals 76 are provided to insure that the quartz disk chamber 40 with plasma 56 is sealed from the outside atmosphere.

Figure 2:
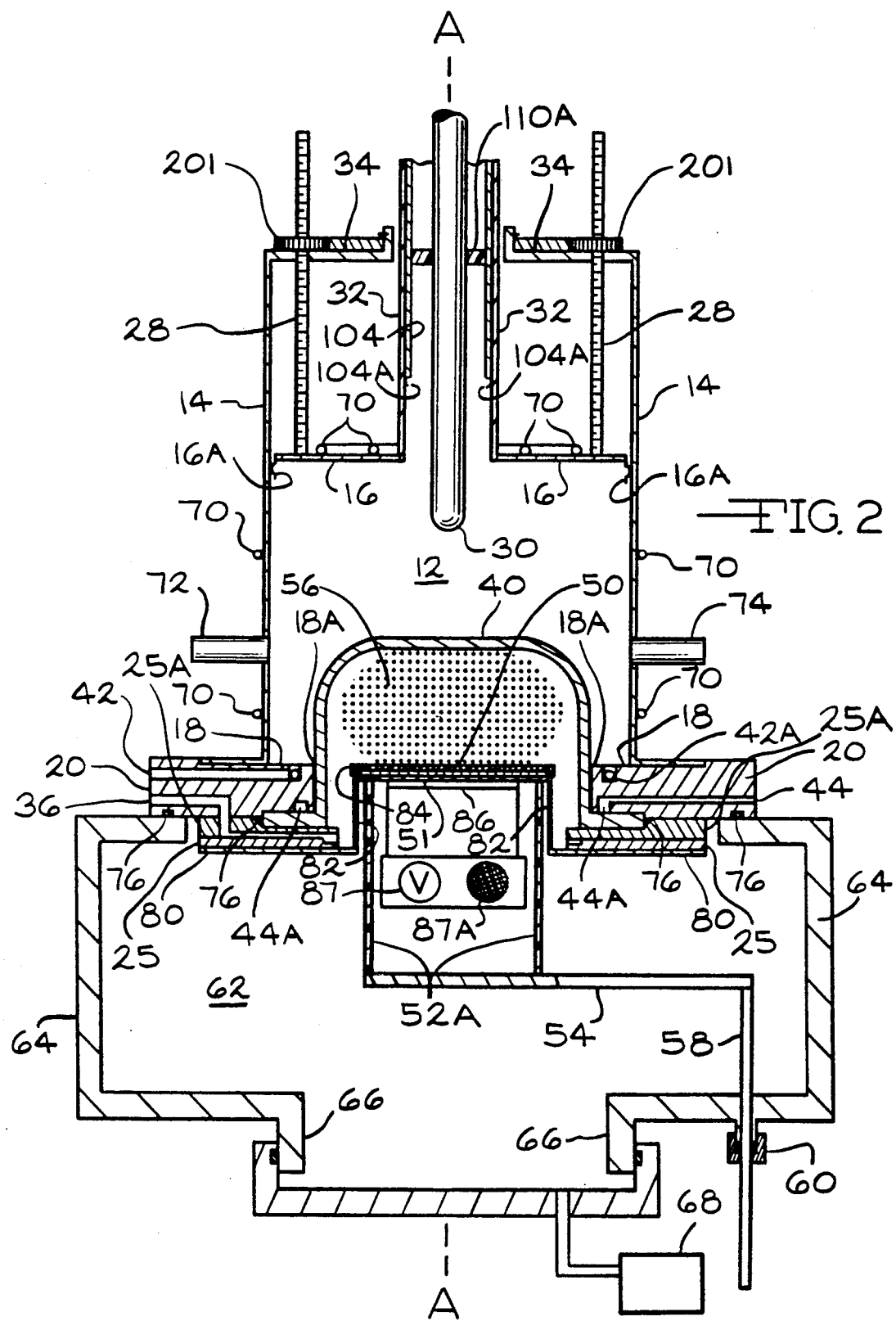
FIGS. 2A and 2B are plan views showing two examples of the flow pattern regulators 84A and 84B when a number of smaller substrates 50A or a large substrate 50B is being coated.
FIGS. 2C and 2D are front views of FIGS. 2A and 2B, respectively, showing the flow pattern of the plasma 56 through holes 84C and 84D of the flow pattern regulators 84A and 84B without the substrates 50A and 50B.

FIG. 2 shows a variation in the gas flow passage of the improved plasma coating apparatus 10. A metal plate 80 is mounted on the underside of the bottom plate 25 and extends towards the longitudinal axis A—A. The metal plate 80 and a metallic tube 82 are sealed together to force the gas to flow through a flow pattern regulator 84, which is mounted on an upper end of tube 82, above the substrate 50 supported on the susceptor 51. Heating and cooling channels 86, which can be liquid or gas cooling tunnels, are provided underneath the susceptor 51 supporting the substrate 50 and are used to control the process temperature of the substrate 50. A power source 87 for the cooling system and a power source 87A for the heating system are connected to the heating and cooling channels 86 provided underneath the susceptor 51 to adjust the process temperature of the substrate surface 50 to be coated.

Figure 2A:
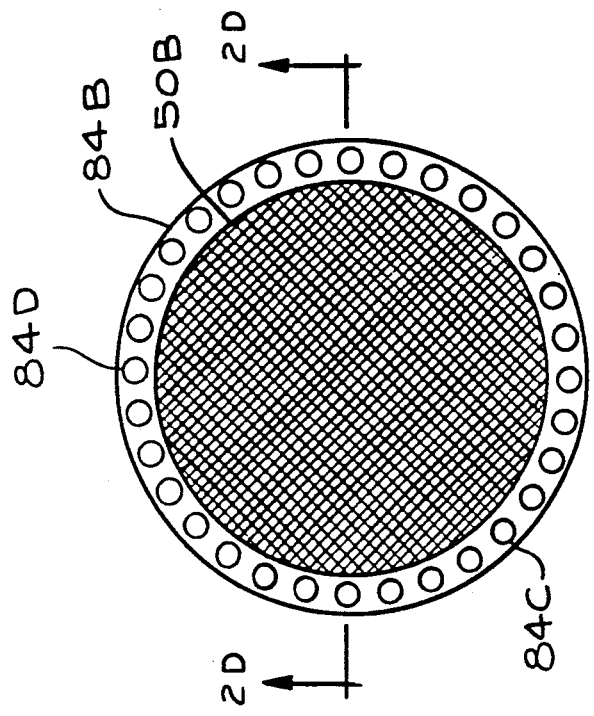
Figure 2B:
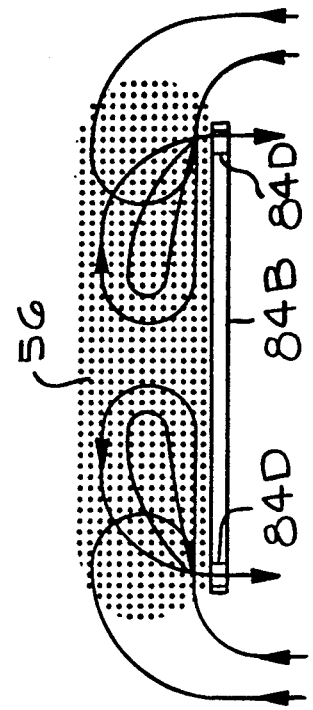
Figure 2C:
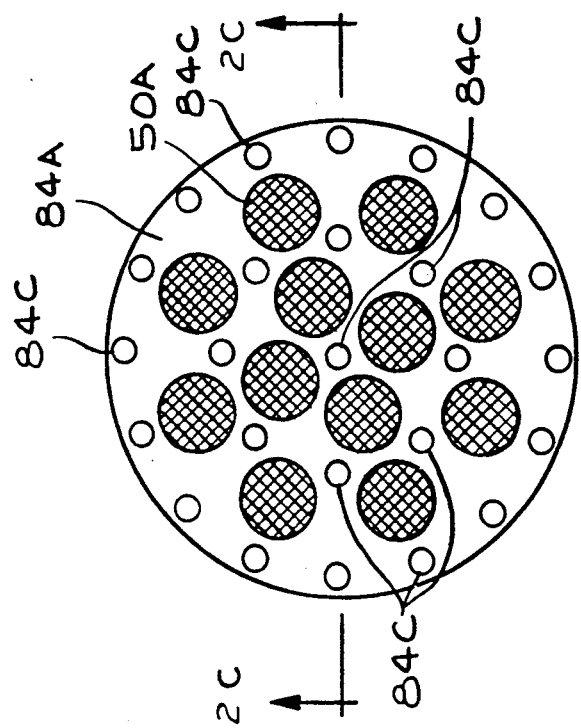
Figure 2D:
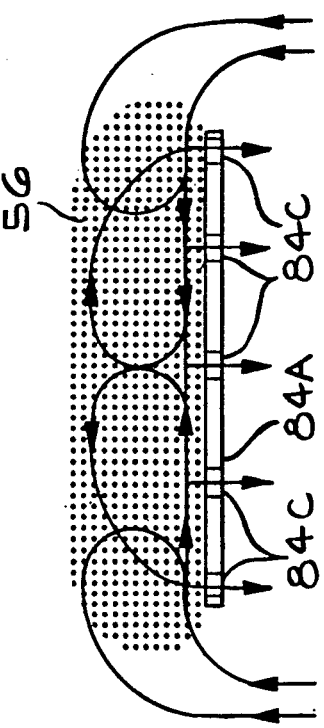

FIGS. 2A and 2B are plan views showing two different embodiments of flow pattern regulators 84A and 84B, respectively, having a series of corresponding holes 84C and 84D directing the way that the gas flows through the plasma 56 and around the substrates 50A and 50B. This configuration increases not only the efficiency of the source gas but also the uniformity of the coating of the substrates 50A and 50B by changing the flow pattern in the plasma 56. FIG. 2A shows the flow pattern regulator 84A where a number of smaller substrates 50A are being coated. Variation of input power, pressure and flow rates along with the flow pattern regulator 84A produce a uniform plasma over the smaller substrates 50A and ensures uniform coating on them. FIG. 2B shows the flow pattern regulator 84B where a large piece of substrate 50B is being coated. Variation of input power, pressure and flow rates along with the flow pattern regulator 84B produces a uniform plasma 56 over the large piece of substrate 50B so that a uniform coating can be obtained. FIG. 2C is a cross-sectional view of FIG. 2A showing the flow pattern of the plasma 56 through holes 84C of the flow pattern regulator 84A, without the substrates 50A. Similarly, FIG. 2D is a cross-sectional view of FIG. 2B showing the flow pattern of the plasma 56 through holes 84D of the flow pattern regulator 84B, without the substrate 50B.

FIG. 3 is a schematic drawing of a multi-flow configuration of the improved plasma coating apparatus 10 wherein the substrate 50 and substrate susceptor 51 are located in a region separated from the plasma 56. The metal plate 80 and metallic tube 82 are sealed together to force the gas flow through the flow pattern regulator 88 (also called the grid) having holes 1 mm to 10 mm in width in the nature of a screen which is electrically conducting. The size of the holes, the flow rate and the speed of the vacuum pump 68 determine the pressure difference between the plasma region 56 and chamber region 90 wherein the substrate 50 is located. In this configuration, the substrate 50 is not in direct contact with the plasma 56, but instead is supported by a non-metallic tube 52A mounted on stage 54. The coating rates at selected areas of the substrate 50 are increased and the heating and cooling channels 86, which can be liquid and gas cooling tunnels provided underneath the susceptor 51 supporting the substrate 50, are used to control the process temperature of the substrate 50. A power source 91 for the cooling system and a power source 91A for the heating system are connected to the heating and cooling channels 86 provided underneath the susceptor 51 to adjust the process temperature of the substrate 50 to be coated.

As shown in FIGS. 1 to 3, the preferred form of the improved coating apparatus 10 limits the extent of the microwaves in the chamber 40 to a plane adjacent the bottom surface 18 of the cavity 12, adjacent the metallic step 18A. This serves to retain the plasma 56 in the upper part of chamber 40 as shown. That way, the plasma 56 density is uniform across the surface area of the substrate 50, which ensures uniform treatment of the substrate 50 surface. This is especially useful for commercial coating or etching of a large area of substrate 50.

FIG. 4 shows an improved plasma coating apparatus 10 where the substrate 50 is located at the lower section of the cavity 12 without the use of metal tube 22 shown in FIG. 1. A portion of the plasma 56 is provided below the bottom surface 18 of the cavity 12 and the metallic step 18A.

FIG. 5 shows the improved plasma coating apparatus 10 having a down stream deposition configuration where the substrate 50 is located outside the cavity 12 and plasma region 56. A metal ring 92 extends inward towards the longitudinal axis A—A from the bottom plate 25. Ring 92 serves to form the bottom end of chamber 12. The substrate 50 can be biased by a wire 93 with a voltage during the coating and the temperature of the substrate 50 can be adjusted by the heating and cooling channel 86. A power source 94 for the cooling system and a power source 94A for the heating system are connected to the heating and cooling channels 86 provided underneath the susceptor 51 to adjust the process temperature of the substrate 50 to be coated. Permanent magnets 96 are held adjacent to the outside of the chamber 40 by the base-plate 20. The magnets 96 are used to enhance plasma formation at low deposition pressures and to promote the coupling of microwave energy to the discharge by electron cyclotron resonance (ECR).

FIG. 6 is a schematic cross-sectioned view of the spherical plasma 56A in a chamber 40A above the substrate 50.

FIG. 7 is a schematic cross-sectioned view of the plasma 56 shown as a hemisphere in the improved plasma coating apparatus 10 shown in FIGS. 1 to 5, by positioning the substrate 50 relative to the susceptor 51 in the plasma 56.

EXAMPLE 1

The microwave circuit used to deliver power into the reactor is described in U.S. Pat. No. 4,777,336 to Asmussen. It consists of (1) a 2.45 gigaHertz, variable power source, (2) circulators and matched dummy loads, (3) directional couplers and power meters that measure the incident power $P_i$, and reflected power $P_r$, from which the power absorbed by the reactor is given by $P_t = P_i - P_r$, (4) the coaxial excitation probe 30 and (5) the cavity 12.

A small reactor as shown in FIG. 1 having a cavity 12 with a 178 millimeter inside diameter wall, a quartz disk chamber 40 with 127 millimeter inside diameter, an end power feed with 41 millimeter inside diameter short sleeve 32 for excitation probe 30, and a resonance breaking metal tube 22 with 76 millimeter outside diameter was built and tested for diamond film growth. A 120 millimeter diameter discharge was created with 200 sccm hydrogen and 2 sccm methane gas flow at 40 Torr with 2500 Watts 2.45 GHz power absorbed. The plasma 56 discharge area produced is larger than any discharge area reported in the open literature. Diamond films were deposited uniformly on 101 millimeter diameter silicon wafers as the substrate 50. The uniform coated area is larger than any coated area reported in the open literature.

The present invention offers advantages over the apparatuses described in the prior art in that it creates a large symmetric, plasma 56 for uniform diamond film deposition over large surface areas of substrate 50. The symmetry of the plasma 56 is ensured by the symmetric, end feed power input of the excitation probe 30 and probe sleeve 32 configuration. The power input system, excitation probe 30 and probe sleeve 32 have large dimensions so that high microwave power (2 to 5 kilowatts) can be delivered into the cavity 12. High input power, low near field effects, a large quartz disk chamber 40 and the design configuration of keeping the vacuum seal between the cavity 12 and chamber 40 away from the heated areas ensure that a large diameter plasma 56 can be created. The equator plane of the plasma 56 is created and defined by the cavity bottom surface 18 with the help of a metallic step 18A near the outside surface of the quartz disk chamber 40 and the lower cavity resonance breaker metal tube 22. The quartz disk chamber 40 ensures only the plasma 56 adjacent to the substrate 50 is produced and thus the efficiency of the absorbed power is maximized. The substrate 50 is located near the equator of the plasma 56, hence the spacial uniformity of the distribution of reactive species and the thickness of deposited diamond film is ensured.

The present invention employs some of the basic features of the conventional microwave plasma disk reactors (MPDR), which have been described in the prior art. They are: (1) cylindrical cavity, (2) internal matching, i.e., sliding short and variable probe; and (3) excitation of $TM_{01}$ modes for deposition of films. However, there are some important differences between the present invention and the conventional MPDR. They are: (1) the probe 30 is mounted on the sliding short 16, not on the cavity 12 side walls, thus all the internal cavity 12 adjustments take place on the sliding short 16; (2) the probe 30 is located at the center of the short 16 and thus only TM modes are easily excited; (3) the probe 30 is located far away from the discharge region so that the probe 30 near field does not interfere with the $TM_{01}$ modes in the discharge region of the plasma 56; (4) a large diameter quartz disk chamber 40 can be used and (5) much higher microwave power can be delivered to the chamber 40 to create a larger diameter plasma 56; (6) with the help of the lower cavity resonance breaker metal tube 22, the cavity bottom surface 18 and the metallic step 18A defines the equator of the symmetric, plasma 56 when the cavity 12 is excited in $TM_{01n}$ modes where n is between 1 and 4; (7) the substrate 50 stage is adjustable in that it can be moved up and down independently, this feature together with the independent sliding short 16 and excitation probe 30 movement allow the movement of the relative position of the substrate 50 with respect to the plasma 56 so that the optimum deposition conditions can be reached; (8) the forced reactive gas flow through the plasma 56 near the substrate 50 improves the efficiency of the reactive gases, and the uniformity of the deposited film; (9) film deposition is adjacent to or down stream from the plasma 56; and (10) the independent and selected area substrate 50 heating or cooling channel 86 increases the deposition area and film uniformity.

It is intended that the foregoing description be only illustrative of the present invention and that the present invention be limited only by the hereinafter appended claims.

We claim:

1. In a plasma generating apparatus for coating a substrate with a material from a plasma including a plasma source employing a radiofrequency, including UHF or microwave, wave coupler means which is metallic and in the shape of a hollow cavity and which is excited in a TM mode of resonance and optionally including a static magnetic field around the plasma which aids in coupling radiofrequency energy at electron cyclotron resonance and aids in confining ions in the plasma in an electrically insulated chamber means in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; movable metal plate means in the cavity mounted in the coupler means perpendicular to the central longitudinal axis and movable along the central longitudinal axis towards and away from the chamber means; and a movable probe means connected to and extending inside the coupler means for coupling the radiofrequency waves to the coupler means, the improvement which comprises:

(a) the probe means which is elongate and is mounted in the coupler means along the central longitudinal axis of the chamber means and coupler means with an end of the probe in spaced relationship to the chamber means; and (b) stage means which forms part of the cavity and provides for mounting a substrate to be coated with the material, the stage means having a support surface which is in a plane around the longitudinal axis and which is movable towards and away from the plasma in the chamber means so that the substrate can be coated with the material from the plasma.

2. The apparatus of claim 1 wherein magnets are provided around and outside of the chamber means.

3. In a plasma generating apparatus for coating a substrate with a material from a plasma including a plasma source employing a radiofrequency, including UHF or microwave, wave coupler means which is metallic and in the shape of a hollow cavity and which is excited in a TM mode of resonance and optionally including a static magnetic field around the plasma which aids in coupling radiofrequency energy at electron cyclotron resonance and aids in confining ions in the plasma in an electrically insulated chamber means in the coupler means, and wherein the chamber means has a central longitudinal axis in common with the coupler means and is mounted in closely spaced and sealed relationship to an area of the coupler means with an opening from the chamber means at one end; gas supply means for providing a gas which is ionized to form the plasma in the chamber means, wherein the radiofrequency wave applied to the coupler means creates and maintains the plasma around the central longitudinal axis in the chamber means; movable metal plate means in the cavity mounted in the coupler means perpendicular to the central longitudinal axis and movable along the central longitudinal axis towards and away from the chamber means; and a movable probe means connected to and extending inside the coupler means for coupling the radiofrequency waves to the coupler means, the improvements which comprises:

(a) the probe means which is elongate and is mounted in the coupler means along the central longitudinal axis of the chamber means and coupler means, with an end of the probe in spaced relationship to the chamber means;

(b) the plate means having an opening along the central longitudinal axis of the chamber means, wherein the plate means supports the probe means so that the probe means can be moved in the opening in the plate means along the central longitudinal axis;

(c) stage means which forms part of the cavity and provides for mounting a substrate to be coated with the material, the stage means having a support surface which is in a plane substantially perpendicular to and around the longitudinal axis and which is movable towards and away from the plasma in the chamber means so that the substrate can be coated with the material from the plasma;

(d) support means for the probe means mounted on the coupler means and including an adjustable means which allows movement of the probe means along the central longitudinal axis of the chamber means so as to vary the spacing between the chamber means and the end of the probe means; and (e) holder means adjustably mounted on the support means and connected to the plate means supporting the probe means so as to allow the plate means to be moved towards and away from the chamber means, wherein movement of the plate means and the probe means in the coupler means achieves a selected TM mode of resonance by iterative movement that adjusts the reflected power to a low level of the radiofrequency wave in the chamber means.

4. The apparatus of claim 3 wherein magnets are provided around the outside of the chamber means.

5. The apparatus of claim 4 wherein the chamber means is shaped as a cylinder around the central longitudinal axis and has cylindrical sides.

6. The apparatus of claim 3 wherein the coupler means is in spaced relationship to the chamber means around the central longitudinal axis and the set of magnets is positioned between the coupler means and the outside wall of the chamber means.

7. The apparatus of claim 3 wherein at least one grid or screen means is provided at the opening at the one end of the chamber means to confine the plasma to the chamber means and to allow removal of ions and excited species generated in the plasma from the chamber means.

8. The apparatus of claim 7 wherein the screen means is supported above the substrate and has a plurality of openings that serve to direct the flow of the plasma so that the material from the plasma moves through the screen means to coat the substrate in a uniform manner.

9. The apparatus of claim 8 wherein the openings are substantially around the perimeter of the screen means.

10. The apparatus of claim 3 wherein the chamber means, probe means, plate means and coupler means are circular in cross-section perpendicular to the central longitudinal axis of the coupler means and the chamber means.

11. The apparatus of claim 3 wherein the gas supply means is provided on an inside wall of the coupler means so as to supply gas to the chamber means.

12. The apparatus of claim 3 wherein the chamber means is shaped as a cylindrical wall around the central longitudinal axis with a cylindrical inside surface and a cylindrical outside surface of the wall, wherein a set of magnets is provided around the central longitudinal axis adjacent the outside surface of the wall of the chamber means.

13. The apparatus of claim 3 wherein a cooling conduit is provided around the chamber means.

14. The apparatus of claim 13 wherein a gas supply means for forming the plasma is provided around the chamber means.

15. The apparatus of claim 14 wherein at least one grid or screen means is provided at the opening at the one end of the chamber means to confine the plasma to the chamber means and to allow controlled removal of ions and excited species generated in the plasma from the chamber means.

16. The apparatus of claim 15 wherein the chamber means, probe means, plate means and coupler means are circular in cross-section perpendicular to the central longitudinal axis of the coupler means and the chamber means.

17. The apparatus of claim 16 wherein the chamber means is comprised of quartz.

18. The apparatus of claim 17 wherein a wall of the coupler means is in spaced relationship to a wall of the chamber means around and perpendicular to the central longitudinal axis with a set of magnets between an inside surface of a wall of the coupler means and the outside surface of the wall of the chamber means and wherein a holding means on the coupler means secures the set of magnets in position between the wall of the chamber means and the wall of the coupler means.

19. The apparatus of claim 1 wherein the coupler means has a length which is greater than a cross-sectional width perpendicular to the longitudinal axis.

20. The apparatus of claim 19 wherein the length of the cavity confining the radiofrequency waves is between about 7 and 40 cm and the width is above about 6 cm at 2.45 GHz.

21. The apparatus of claim 1 mounted on a vacuum system.

* * * * *